United States Patent
Ayyapureddi et al.

(10) Patent No.: US 12,182,413 B2
(45) Date of Patent: Dec. 31, 2024

(54) AREA-OPTIMIZED ROW HAMMER MITIGATION

(71) Applicant: Micron Technology, Inc., Boise, ID (US)

(72) Inventors: Sujeet Ayyapureddi, Boise, ID (US); Yang Lu, Boise, ID (US); Edmund Gieske, Boise, ID (US); Cagdas Dirik, Boise, ID (US); Ameen D. Akel, Boise, ID (US); Elliott C. Cooper-Balis, Boise, ID (US); Amitava Majumdar, Boise, ID (US); Danilo Caraccio, Boise, ID (US); Robert M. Walker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 298 days.

(21) Appl. No.: 17/897,813

(22) Filed: Aug. 29, 2022

(65) Prior Publication Data

US 2023/0236735 A1 Jul. 27, 2023

Related U.S. Application Data (60) Provisional application No. 63/302,050, filed on Jan. 22, 2022.

(51) Int. Cl.
    *G06F 11/07* (2006.01)
    *G06F 3/06* (2006.01)

(52) U.S. Cl.
    CPC .......... *G06F 3/0616* (2013.01); *G06F 3/0629* (2013.01); *G06F 3/0673* (2013.01); *G06F 11/073* (2013.01); *G06F 11/076* (2013.01)

(58) Field of Classification Search
    CPC .... G06F 3/0616; G06F 3/0629; G06F 3/0673; G06F 11/073; G06F 11/076; G11C 15/04; G11C 11/40611; G11C 11/40622; G11C 11/4078; G11C 29/52
    See application file for complete search history.

(56) References Cited

U.S. PATENT DOCUMENTS

| | | | |
|---|---|---|---|
| 11,568,917 B1 * | 1/2023 | Shin | G11C 11/4078 |
| 11,615,861 B2 * | 3/2023 | Kim | G11C 29/42 365/185.09 |
| 2021/0049269 A1 * | 2/2021 | Ghosh | G06F 21/79 |
| 2021/0303683 A1 * | 9/2021 | Elad | G06F 21/554 |
| 2022/0068348 A1 * | 3/2022 | Bennett | G11C 11/4096 |

* cited by examiner

*Primary Examiner* — Ali S Abyaneh
(74) *Attorney, Agent, or Firm* — Wood IP LLC; Theodore A. Wood (57) ABSTRACT

Systems and methods for area-efficient mitigation of errors that are caused by row hammer attacks and the like in a memory media device are described. The counters for counting row accesses are maintained in a content addressable memory (CAM) the provides fast access times. The detection of errors is deterministically performed while maintaining a number of row access counters that is smaller than the total number of rows protected in the memory media device. The circuitry for the detection and mitigation may be in the memory media device or in a memory controller to which the memory media device attaches. The memory media device may be dynamic random access memory (DRAM).

19 Claims, 7 Drawing Sheets

AREA-OPTIMIZED ROW HAMMER MITIGATION

CROSS-REFERENCE TO RELATED APPLICATIONS

This application claims priority from U.S. Provisional Application No. 63/302,050, filed Jan. 22, 2022, the contents of which are hereby incorporated by reference. Additionally, this application is related to the following commonly assigned U.S. patent applications Ser. No.: 17/941,551, filed Sep. 9, 2022, entitled "Cache-Assisted Row Hammer Mitigation;" 17/941,558, filed Sep. 9, 2022, entitled "Memory Media Row Activation-Biased Caching;" 17/940,785, filed Sep. 8, 2022, entitled "Row Hammer Interrupts to the Operating System;" 17/898,737, filed Aug. 30, 2022, entitled "Practical and Efficient Row Hammer Error Detector;" 17/941,655, filed Sep. 9, 2022, entitled "Aliased Row Hammer Detector," the contents of each of which is hereby incorporated by reference.

FIELD OF TECHNOLOGY

The present disclosure relates to deterministic detection of row hammer errors in memory media.

BACKGROUND

Memory devices (also referred to as "memory media devices") are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), flash memory, and others. Memory devices may be volatile or non-volatile. Volatile memory cells (e.g., DRAM cells) may lose their programmed states over time unless they are periodically refreshed by an external power source. SRAM memory may maintain their programmed states for the duration of the system being powered on. Non-volatile memory cells (e.g., NAND memory cells) may maintain their programmed states for extended periods of time even in the absence of an external power source.

Memory devices may be coupled to a host (e.g., a host computing device) to store data, commands, and/or instructions for use by the host while the computer or other electronic system is operating. For example, data, commands, and/or instructions can be transferred between the host and the memory device(s) during operation of a computing or other electronic system. A controller, referred to as a "memory controller", may be used to manage the transfer of data, commands, and/or instructions between the host and the memory devices.

DRAM is organized as an array of storage cells with each cell storing a programmed value. As noted above, the cells can lose their programmed values if not periodically refreshed. Thus, the rows are refreshed at a fixed interval often referred to as the "refresh interval". The refresh is also called a "row activation". In a row activation, a row in the DRAM device is read, error corrected and written back to that same physical row. Data corruption caused by "row hammer events" (also referred to as "row hammer attacks") are a significant risk in recent DRAM devices.

A row hammer event occurs when a particular row in a media device is accessed too many times, that is, more than a "row hammer threshold" (RHT) number of times, in an "activation interval" (i.e., the interval between two refresh/activation events). Specifically, when a particular row (an "aggressor row") is accessed more than a RHT number of times during an activation interval, one or more rows ("victim rows") that are physically proximate to that particular row in the DRAM media can be affected as a result of the frequent activation of the particular row, and data corruption of the one or more rows may occur. Due to various physical effects of shrinking manufacturing process geometries, the RHT of memory devices has decreased to a level at which even normal computer system programs can inadvertently corrupt their own data or the data of another program sharing the same system's memory. Conventional row hammer detection techniques are either practical but imperfect allowing data corruption or severe performance degradation, or perfect but impractically costly in required resources such as silicon area.

Conventional row hammer detector algorithms, such as "Address Sampling" and "Priority CAM" (priority content addressable memory) are probabilistic and thus cannot guarantee perfect (i.e., complete, accurate, and precise) prevention of data corruption in any and all row hammer scenarios. If an aggressor (e.g., a malicious attacker) knows sufficient details of these conventional row hammer detection methods and their implementation, the aggressor can attack their weaknesses to bypass or break them and corrupt data.

The "direct" or "perfect" row tracking method, in which a counter is maintained for each row in the DRAM media, is a known perfect row hammer detection algorithm, but its implementation requires both amounts of memory and operating power that are too high to be practically useful.

Guaranteed row hammer event elimination is compelling for any memory device, but is especially compelling for systems such as, for example, hyperscale datacenters (HSDC). In HSDCs, typically multiple customers share processors and memory. A malicious attacker can use row hammer attacks to silently (e.g., without detection) corrupt other customers' data to possibly escalate its privilege to take control of more system resources or compromise data center security.

Currently row hammer corruption is indistinguishable from other soft errors. Modern workloads thrash processor caches and cause unintentional row hammer scenarios. Detected errors beyond a threshold rate require physical service of the dual in-line memory modules (DIMMs) which are often returned to the supplier for credit.

Therefore, improved techniques for mitigating soft errors such as row hammer errors are desired.

DETAILED DESCRIPTION

Currently row hammer corruption is indistinguishable from other soft errors. Modern workloads thrash processor caches and cause unintentional row hammer scenarios. Detected errors beyond a threshold rate require physical service of the dual in-line memory modules (DIMMs) which are often returned to the supplier for credit. Therefore, improved techniques for mitigating soft errors such as row hammer errors are desired.

Figure 1:
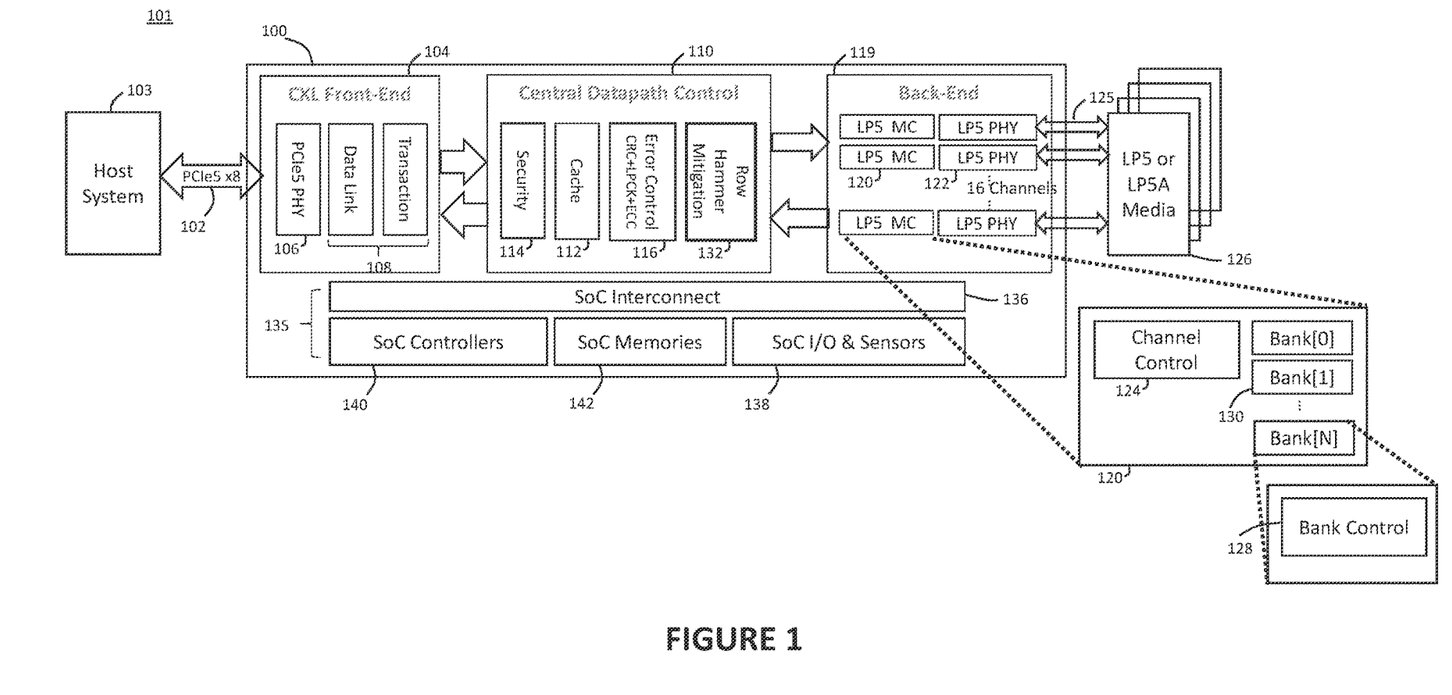
FIG. 1 illustrates an example functional block diagram in the form of a computing system including a memory controller configured for detecting row hammer attacks in accordance with some example embodiments of the present disclosure.

FIG. 1 illustrates an example functional block diagram in the form of a computing system 101 including a memory controller 100 configured for detecting row hammer attacks in accordance with some example embodiments of the present disclosure. The computing system 101 can detect and mitigate row hammer attacks on one or more memory devices 126. The memory controller 100 comprises a front-end portion 104, a central controller portion 110, a back-end portion 119, and a management unit 135. The memory controller 100 can be coupled to a host 103 (i.e., host system 103) and memory device 126. In some embodiments, memory device 126 may be a DRAM device.

The front-end portion 104 includes an interface 106 to couple the memory controller 100 to the host 103 through one or more input/output (I/O) lanes 102. The communications over I/O lanes 102 may be according to a protocol such as, for example, Peripheral Component Interconnect Express (PCIe). In some embodiments, the plurality of I/O lanes 102 can be configured as a single port. Example embodiments are not limited by the number of I/O lanes, whether or not the I/O lanes belong to a single port, or the communication protocol for communicating with the host. The interface 106 receives data and/or commands from host 103 through I/O lanes 102. In an embodiment, the interface 106 is a physical (PHY) interface configured for PCIe communications. The front-end portion 104 may include interface management circuitry 108 (including data link and transaction control) which may provide higher layer protocol support for communications with host 103 through PHY interface 106.

The central controller portion 110 is configured to control, in response to receiving a request or command from host 103, performance of a memory operation. The memory operation can be a memory operation to read data from, or write data to, memory device 126. The central controller portion 110 may comprise a cache memory 112 to store data associated with the performance of the memory operation, a security component 114 configured to encrypt the data before storing, and to decrypt data after reading, the data in memory device 126.

In some embodiments, in response to receiving a request from host 103, data from host 103 can be stored in cache lines of cache memory 112. The data in the cache memory can be written to memory device 126. An error correction component 116 is configured to provide error correction to data read from and/or written to memory device 126. In some embodiments, the data can be encrypted using an encryption protocol such as, for example, Advanced Encryption Standard (AES) encryption, before the data is stored in the cache memory. In some embodiments, the central controller portion 110 can, in response to receiving a request from host 103, control writing of multiple pages of data substantially simultaneously to memory device 126.

The management unit 135 is configured to control operations of the memory controller 100. The management unit may recognize commands from the host 103 and accordingly manage the one or more memory devices 126. In some embodiments, the management unit 135 includes an I/O bus 138 to manage out-of-band data, a management unit controller 140 to execute a firmware whose functionalities include, but not limited to, monitoring and configuring the characteristics of the memory controller 100, and a management unit memory 142 to store data associated with memory controller 100 functionalities. The management unit controller 140 may also execute instructions associated with initializing and configuring the characteristics of the memory controller 100. An endpoint of the management unit 135 can be exposed to the host system 103 to manage data through a communication channel using the I/O bus 138.

A second endpoint of the management unit 135 can be exposed to the host system 103 to manage data through a communication channel using interface 106. In some embodiments, the characteristics monitored by the management unit 135 can include a voltage supplied to the memory controller 100 or a temperature measured by an external sensor, or both. Further, the management unit 135 can include a local bus interconnect 136 to couple different components of the memory controller 100. In some embodiments, the local bus interconnect 136 can include, but is not limited to, an advanced high performance bus (AHB).

The management unit 135 can include a management unit controller 140. In some embodiments, the management unit controller 140 can be a controller that meets the Joint Test Action Group (JTAG) standard and operate according to an Inter-Integrate Circuit (I2C) protocol, and auxiliary I/O circuitry. As used herein, the term "JTAG" generally refers to an industry standard for verifying designs and testing printed circuity boards after manufacture. As used herein, the term "I2C" generally refers to a serial protocol for a two-wire interface to connect low-speed devices like microcontrollers, I/O interfaces, and other similar peripherals in embedded systems.

The back-end portion 119 is configured to couple to one or more types of memory devices (e.g., DRAM device 126) via (e.g., through) a plurality of channels 125, which can be used to read/write data to/from the memory devices 126, to transmit commands to memory device 126, to receive status and statistics from memory device 126, etc. The management unit 135 can couple, by initializing and/or configuring the memory controller 100 and/or the memory device 126 accordingly, the memory controller 100 to external circuitry or an external device, such as host 103 that can generate requests to read or write data to and/or from the memory device(s). The management unit 135 is configured to recognize received commands from the host 103 and to execute instructions to apply a particular operation code associated with received host commands for each of a plurality of channels coupled to the memory device 126.

The back-end portion 119 includes a media controller portion comprising a plurality of media controllers 120 and a physical (PHY) layer portion comprising a plurality of PHY interfaces 122. In some embodiments, the back-end portion 119 is configured to couple the PHY interfaces 122 to a plurality of memory ranks of the memory device 126. Memory ranks can be connected to the memory controller 100 via a plurality of channels 125. A respective media controller 120 and a corresponding PHY interface 122 may drive a channel 125 to a memory rank. In some embodiments, each media controller 120 can execute commands independent of the other media controllers 120. Therefore, data can be transferred from one PHY interface 122 through a channel 125 to memory device 126 independent of other PHY interfaces 122 and channels 125.

Each PHY interface 122 may operate in accordance with a PHY layer that couples the memory controller 100 to one or more memory ranks in the memory device 126. As used herein, the term "PHY layer" generally refers to the physical layer in the Open Systems Interconnection Wood IP Ref. No.: MICR/38002US (OSI) model of a computing system. The PHY layer may be the first (e.g., lowest) layer of the OSI model and can be used to transfer data over a physical data transmission medium. In some embodiments, the physical data transmission medium can be a plurality of channels 125. As used herein, the term "memory ranks" generally refers to a plurality of memory chips (e.g., DRAM memory chips) that can be accessed simultaneously. In some embodiments, a memory device 126 may include a plurality of memory ranks. In some embodiments, a memory rank can be sixty-four (64) bits wide and each memory rank can have eight (8) pages. In some embodiments, a page size of a first type of memory device can be larger than a page size of the second type of memory device. Example embodiments, however, are not limited to particular widths of memory ranks or page sizes.

Each media controller 120 may include a channel control circuitry 124 and a plurality of bank control circuitry 128 where a respective one of the plurality of bank control circuitry 128 is configured to access a respective bank 130 of the plurality of banks on the media device 126 accessed by the respective media controller 120.

Rank, channel, and bank can be considered hardware-dependent logical groupings of storage locations in the media device. The mapping of rank, channel and bank logical groupings to physical storage locations or rows in the memory device 126 may be preconfigured or may be configurable in some embodiments by the host system 103 and/or memory controller 100 in communication with the memory device 126. A bank 130 maps to a block of memory cells in a DRAM chip, a rank includes one or more DRAM chips, and each channel may provide access to a respective group of one or more ranks. Thus, each channel provides access to a respective group of a plurality of banks. Each channel may be configured to access a respective group of one or more ranks of the memory device 126, where each rank includes one or more DRAM chips.

A row hammer (RH) mitigation component 132 may be arranged within memory controller 100 to perform detection of soft memory errors, such as, for example, row hammer attacks, on memory devices 126 attached to the memory controller 100. The RH mitigation component 132 may be configured to, in addition to performing detection of row hammer attacks, to upon such detection, also trigger a response to the detected error. In some embodiments, RH mitigation component 132 may receive row access statistics for the memory device 126 and may output a response to refresh one or more rows of the memory device 126. The RH mitigation component 132 and its operation is described below in more detail.

In some embodiments, the memory controller 100 can be a Compute Express Link™ (CXL) compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost. CXL is designed to be an industry open standard interface for high-speed communications, as accelerators are increasingly used to complement CPUs in support of emerging applications such as artificial intelligence and machine learning. CXL technology is built on the peripheral component interconnect express (PCIe) infrastructure, leveraging PCIe physical and electrical interfaces to provide advanced protocol in areas such as input/output (I/O) protocol, memory protocol (e.g., initially allowing a host to share memory with an accelerator), and coherency interface. When the memory controller 100 is CXL compliant, the interface management circuitry 108 (including data link and transaction control 108) may use CXL protocols to manage the interface 106 which may comprise PCIe PHY interfaces.

According to some embodiments, the memory device 126 includes one or more DRAM devices. In some embodiments, main memory is stored in DRAM cells that have high storage density. DRAM cells lose their state over time. That is, the DRAM cells must be refreshed periodically, hence the name "Dynamic". DRAM can be described as being organized according to a hierarchy of storage organization comprising DIMM, rank, bank, and array. A DIMM comprises a plurality of DRAM chips, and the plurality of chips in a DIMM are organized into one or more "ranks". Each chip is formed of a plurality of "banks". A bank is formed of one or more "rows" of the array of memory cells. All banks within the rank share all address and control pins. All banks are independent, but in some embodiments only one bank in a rank can be accessed at a time. Because of electrical constraints, only a few DIMMs can be attached to a bus. Ranks help increase the capacity on a DIMM.

Multiple DRAM chips are used for every access to improve data transfer bandwidth. Multiple banks are provided so that the computing system can be simultaneously working on different requests. To maximize density, arrays within a bank are made large, rows are wide, and row buffers are wide (8 KB read for a 64 B request). Each array provides a single bit to the output pin in a cycle (for high density and because there are few pins). DRAM chips are often described as xN, where N refers to the number of output pins; one rank may be composed of eight x8 DRAM chips (e.g., the data bus is 64 bits). Banks and ranks offer memory parallelism, and the memory controller 100 may schedule memory accesses to maximize row buffer hit rates and bank/rank parallelism.

In the embodiment illustrated in FIG. 1, the memory device 126 is low power double data rate (LPDDR) LP5 or LP5A DRAM media. However, embodiments are not limited thereto, and memory device 126 may comprise one or more memory media of any memory media types, such as, but not limited to, types of DRAM, that are subject to row hammer attacks or similar memory attacks.

Each of the plurality of media controllers 120 can receive a same command and address and drive the plurality of channels 125 substantially simultaneously. By using the same command and address for the plurality of media controllers, each of the plurality of media controllers 120 can utilize the plurality of channels 125 to perform the same memory operation on the same plurality memory cells. Each media controller 120 can correspond to a RAID component. As used herein, the term "substantially" intends that the characteristic needs are not absolute but is close enough so as to achieve the advantages of the characteristic.

For example, "substantially simultaneously" is not limited to operations that are performed absolutely simultaneously and can include timings that are intended to be simultaneous but due to manufacturing limitations may not be precisely simultaneously. For example, due to read/write delays that may be exhibited by various interfaces (e.g., LPDDR5 vs. PCIe), media controllers that are utilized "substantially simultaneously" may not start or finish at the same time. For example, the multiple memory controllers can be utilized such that they are writing data to the memory devices at the same time regardless of whether one of the media controllers commences or terminates prior to the other.

Figure 2A:
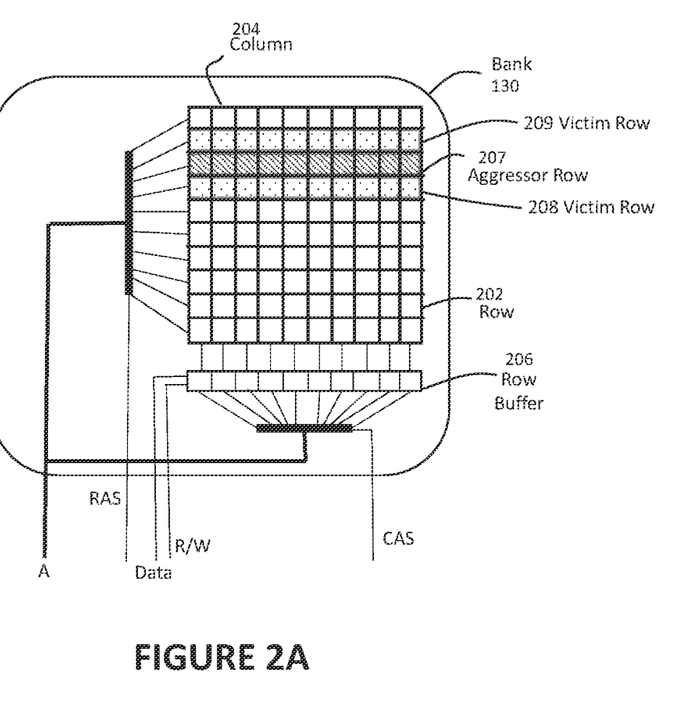
FIG. 2A illustrates a schematic view of a memory bank in a DRAM media device.

FIG. 2A illustrates a schematic view of a memory bank 130 viewed in a DRAM device such as memory device 126. The illustrated bank 130 represents an 10×10 array of cells organized in 10 rows (e.g., row 202) and 10 columns (e.g., column 204). The bank is stored to or read from, one row at a time, via a row buffer 206. Each cell in the array is accessed by providing a row address and a column address. The address bus, a row access strobe signal, a column access strobe signal (shown in FIG. 2A as A, RAS, CAS, respectively) are used to access particular memory locations in the array. The row buffer 206 and the data or read/write signals are used for the data to be read from or stored to memory locations.

The illustrated rows 207, 208 and 209 illustrate an example aggressor row 207 and one or more proximate rows (e.g., victim rows 208 and 209) on either side of the aggressor row 207. As noted above, when the aggressor row 207 is accessed more than a RHT number of times during a particular interval such as the refresh interval, it may be expected that the data stored in the victim rows 208 and 209 can be corrupted and thus those victim rows need to be refreshed. The RHT and also the number of rows on each side of the aggressor row that are considered victim rows may be memory device dependent. In some memory devices, a counter, not shown in FIG. 2A, may be associated with a row to keep track of the number of times that row has been activated during a particular time interval. For example, the counter may be initialized at the beginning of each refresh interval and be incremented for each access to that row during that refresh interval. In conventional perfect tracking implementations, a respective counter was associated with each row. Since memory devices 126 can have millions or even billions of rows, having a counter for each physical row in the memory device can be very costly in terms of the area (e.g., silicon or memory area) required for the counters.

In example embodiments, the number of counters maintained for purposed of memory error detection due to excessive row accesses is much smaller than the total number of rows in the memory device(s) attached to the memory controller.

Figure 2B:
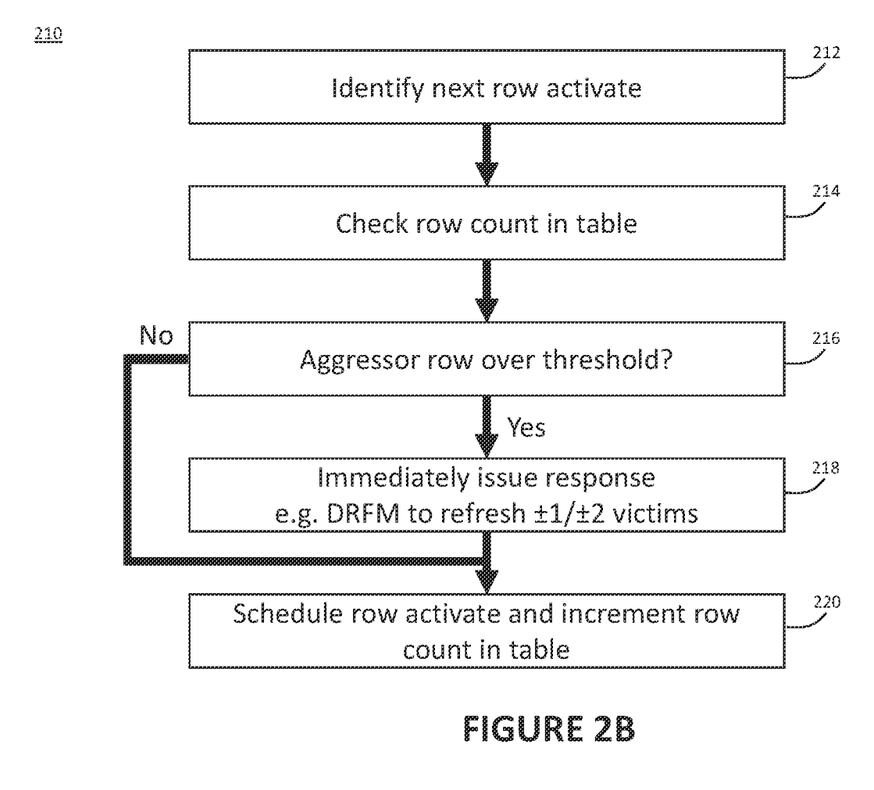
FIG. 2B illustrates a flowchart depicting a basic implementation flow of row hammer mitigation.

FIG. 2B illustrates a flowchart 210 depicting a basic implementation flow of row hammer mitigation. Row hammer mitigation includes two aspects: the first aspect is row hammer detection, and the second aspect is the response to that detection. A variety of responses are possible, with a response commanding the memory device 126 to refresh victim rows (e.g., DRFM response) being one of the possible responses to mitigate or eliminate the effects of row hammer effects. In some instances, the memory controller transmits a refresh command, such as a DRFM response, to the memory device 126 and specifies the aggressor row, and the memory device's internal circuitry determines the victim rows to be refreshed based on the aggressor row identified by the memory controller and refreshes the victim rows.

When a request is received to access a row, which may be referred to as the "aggressor row" (row 207 in FIG. 2A) in this disclosure, in the memory device 126, at operation 212 that row is identified as the next row to activate. At operation 214, a value of a counter configured to keep track of the number of accesses to the aggressor row in a predetermined time period is checked. At operation 216, it is determined whether the value of the counter is above the RHT. When the RHT is exceeded for the aggressor row 207, the integrity of the data in one or more rows (referred to as "victim rows"; see rows 208 and 209 in FIG. 2A) physically adjacent to the aggressor row 207 cannot be guaranteed. The RHT may be factory set or may be configured at boot time. If the value is above the RHT, then at operation 218 a response is issued.

One type of response may be a digital refresh management (DRFM) command to refresh the physically adjacent rows (e.g., rows 208 and 209) on either side of the aggressor row 207. When a response is issued at operation 218, the counters of the victim rows (e.g., rows 208 and 209) which are refreshed can be reset (e.g., set the count value to 0). Note that the aggressor row's counter is reset when it's count exceeds RHT, and a response is issued to refresh its victim row. The number of physically adjacent rows to refresh may be preconfigured or may be dynamically determined. After issuing the response at 218, or if at operation 216 it was determined that the aggressor row 207 is not over the RHT, at operation 220, the row activate for the aggressor row is scheduled and the counter for that row is incremented (e.g., incremented by 1).

As noted above, memory device 126 such as, for example, one or more DRAM DIMMs, can be subject to row hammer attacks, and several approaches are being used to either eliminate or reduce the effects of such attacks. Whereas the conventional techniques of row hammer mitigation that are currently implemented in memory systems, to the knowledge of the inventors, fall short in terms of practicality in either energy efficiency and/or space efficiency, the example embodiments of the present disclosure provide a row hammer mitigation technique that provides perfect tracking (i.e. does not allow any false negative row hammer detection) of row hammer attacks in a space efficient manner.

Figure 3A:
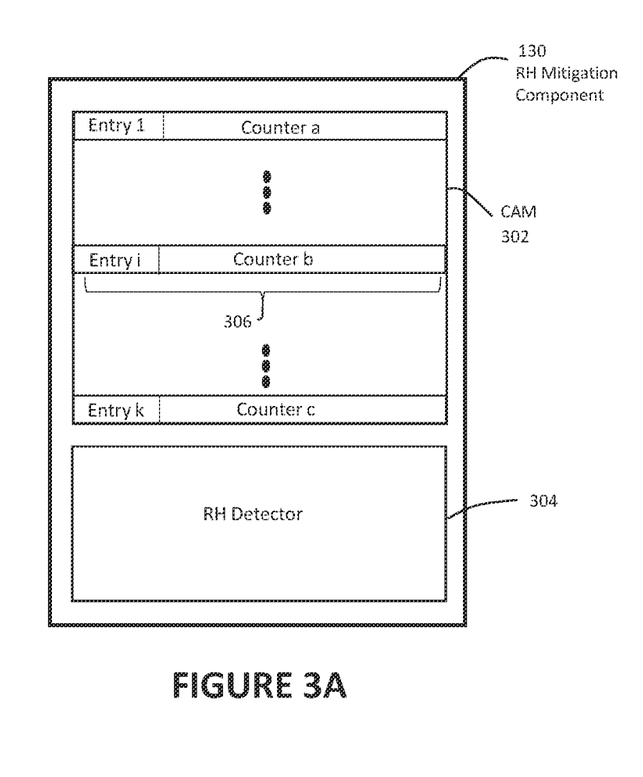
FIG. 3A illustrates a logical block diagram of a row hammer mitigation component, according to some embodiments.

FIG. 3A illustrates a logical block diagram of a row hammer mitigation component 132 according to some embodiments. In FIG. 1, the row hammer mitigation component 132 is illustrated as being arranged within the memory controller 100. However, in some other embodiments, the row hammer mitigation component 132 can be arranged in the memory device 126. In yet other example embodiments, the row hammer mitigation component 132 may not be arranged within either the memory device 126 or within memory controller 100, but externally to both memory device 126 and memory controller 100. In example embodiments, the row hammer mitigation component 132 receives row access counts of the memory device 126 as input and provides a response to detected row hammer events as output.

In some embodiments, having the row hammer mitigation component 132 arranged in the memory controller 100 enables taking advantage of the fact that the memory controller communicates with all memory devices 126 that are attached. For example, row hammer mitigation component 132 on the memory controller 100 can use common row addresses among multiple memory devices 126 in a group of one or more channels. For example, in an example embodiment in which 15 DRAM devices are attached to the memory controller 100, a channel may be configured to group 5 of the DRAM devices together such that they respond to the same row addresses (row IDs) from the memory controller.

In respectively different example embodiments, in the memory controller 100, the row hammer mitigation component 132 may be arranged within the central controller 110, at a channel level in a media controller 120 in the back-end 119, or at a bank level in a bank 130. For example, at the central control 110, the row hammer mitigation component 132 may monitor may monitor all rows in all media devices 126 connected to all media controllers 120; at the channel level, a plurality of row hammer mitigation components 132 may be implemented with each monitoring the rows configured as belonging to that channel; and at the bank level, a plurality of row hammer mitigation components 132 may be implemented with each monitoring the rows configured as belonging to that bank.

In some example scenarios in which one or more DRAM memory devices 126 are attached to a CXL-compliant memory controller, the global rate of row hammer attacks on the memory device may be about 625 million attacks per second. Thus, if perfect row hammer detection is implemented at the global level for the attached memory device, the row hammer detector must be configured with sufficient counters to detect at least that many attacks occurring in the duration of a second. For example, in the example embodiment shown in FIG. 1, if perfect row tracking were to be implemented globally, the central controller 110 could be configured with a row hammer mitigation circuitry that receives row access information for rows in the attached memory device from the media controllers 120 potentially at the rate of 625 million per second, and communicates mitigation responses (e.g., DRFM) to the respective media controllers 120 as needed.

If per-channel row hammer mitigation is implemented for each media controller 120, then the sum of the attack rates that can be handled by the respective media controllers 120 must at least amount to the 625 million/sec, but such an implementation will be capable of, and accordingly use the space and energy resources required, for tracking a substantially higher rate of row updates because the resources are configured on a per channel basis.

Similarly, if per-bank row hammer mitigation is implemented in each bank controller 128 for each bank in a channel, then the sum of attack rates that can be handled by all the bank controllers must at least amount to the 625 million/sec, but such an implementation will be capable of, and accordingly use the space and energy resources required for, detecting a substantially higher detection rate because the resources are configured on a per-bank basis. Thus, the total amount of space and energy resources that may be required to implement row hammer detection at the bank level may exceed the amount of space and energy resources that may be required at the channel level, which in turn exceeds that of the global level implementation.

Thus, various approaches may be considered to achieve perfect (deterministic) row hammer tracking in the memory controller by accessing multiple rows as one unit (same row on different chips) and thus having only one counter for the group, rather than having a counter for each row of the media device.

A motivation for the approach to a solution described in this disclosure is to, instead of having a counter for each and every row of the memory device, bound the number of counters by the number of potential attacks in a timeframe because only so many attacks can happen, for example, in a 60-millisecond timeframe. In example embodiments, the total number of counters and thus the size of the detector and the amount of resources devoted to the detector, is bound by the total potential number of attacks, not the total amount of memory to protect. Thus, in effect, example embodiments provide a detector algorithm that scales with the maximum potential attacks per unit time as opposed to the maximum memory capacity that is being protected.

A problem with having a separate counter for each row that is being monitored is that, as a big system is created, the memory may grow to many millions, if not a billion, rows. Then having a billion counters, one per row, may yield a billion counters. A billion is a lot more than 625 million per second attacks per second being divided 60 milliseconds, which reduces the number of required counters to the thousands instead of the billions or million that would be required to have a counter for each row of protected memory. Thus, embodiments of the present disclosure provide a row hammer detector that scales with the maximum potential attacks per unit time as opposed to the maximum memory capacity being protected.

As noted above, memory device 126 such as, for example, DRAM, can be subject to row hammer attacks, and several approaches are being used to either eliminate or reduce the effects of such attacks. Whereas the conventional techniques of row hammer mitigation that are currently implemented in memory systems, to the knowledge of the inventors, fall short in space efficiency, the present disclosure provides a row hammer mitigation technique that provides perfect tracking (i.e., does not allow any false negative row hammer detection) of row hammer attacks in a space-efficient manner.

As shown in FIG. 3A, row hammer mitigation component 132 according to example embodiments includes a content addressable memory (CAM) 302 to store the counters for the monitored memory rows and a row hammer detector 304. The row hammer detector 304 includes circuitry that monitors the corresponding rows of the memory device 126 for row hammer attacks and when an attack or potential attack is detected, responds appropriately. The CAM 302 is used by the row hammer detector 304 to maintain counters and, optionally, other state associated with the row hammer detection of the corresponding monitored rows.

Figure 3B:
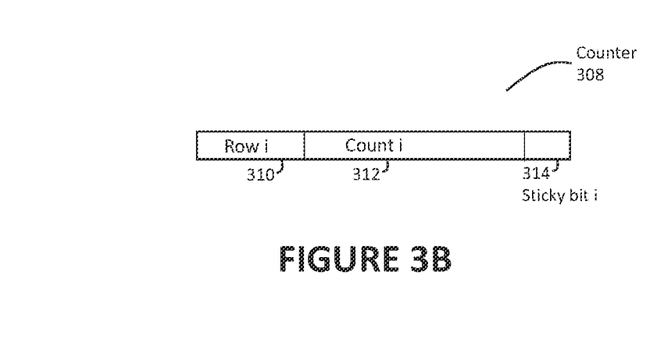
FIG. 3B illustrates a counter maintained by the row hammer mitigation component of FIG. 3A, according to some embodiments.

The CAM 302 includes a plurality entry 306, for example, entries 1 . . . k, where k can be any positive integer. Each entry 306 in the CAM 302 represents a row counter 308 corresponding to a row being monitored. FIG. 3B illustrates an example counter 308 that includes the row address (row ID) 310, the count 312, and optionally, a sticky bit 314. The size of the row ID field 310 may be based on the total number of rows that are being monitored on memory device 126 and/or the number of rows that the memory controller 110 can address on the memory device 126. The size of the count 312 field may be based on the maximum number of row accesses that is expected to be made on any particular row in the memory device 126. In some embodiments, instead of the sticky bit, a flag field of more than one bit may be included in the counter.

As noted above, conventional techniques for deterministic row hammer detection required a number of counters that is at least the same as the number of rows being monitored, i.e. techniques required a dedicated counter for each row being monitored. In contrast to conventional techniques that provided deterministic row hammer detection, example embodiments of this disclosure are configured to provide deterministic detection using the CAM 302 which stored a number of counters that is much smaller that the number of rows being monitored.

The "space saving" algorithm, which was first described in Metwally et al., "Efficient Computation of Frequent and Top-k Elements in Data Streams," Technical Report 2005-23, University of California, Santa Barbara, September 2005 ("Metwally"), describes a technique to find the most active users of a particular resource or service. The primary use case described in Metwally is a technique to find a specified number of highest users of a web service. The space saving algorithm can be used to perform deterministic row hammer detection with a lower number of counters than the number of counters that would be required when using one counter per row in the memory device. Viewed at a high level, the space saving algorithm maintains only the top k (where k may be a predetermined positive number) counters and thus requires much less space for counters. Thus, the space saving algorithm is called space saving because it is only counting the rows that need to be counted as opposed to having a counter for every row. That by definition saves orders of magnitude of space.

The row hammer mitigation component 132, in the embodiments primarily described in this disclosure, are included in the memory controller 100. Including the row hammer mitigation circuitry, for example, the hammer mitigation component(s) 132, in the memory controller 100 is advantageous because all accesses to the memory devices 126 protected by the row hammer mitigation circuitry flow through the memory controller 100. However, embodiments of this disclosure are not limited to implementing the row hammer component 132 in the memory controller 100. In some embodiments, the row hammer component 132 can be implemented externally to the memory controller.

Figure 4:
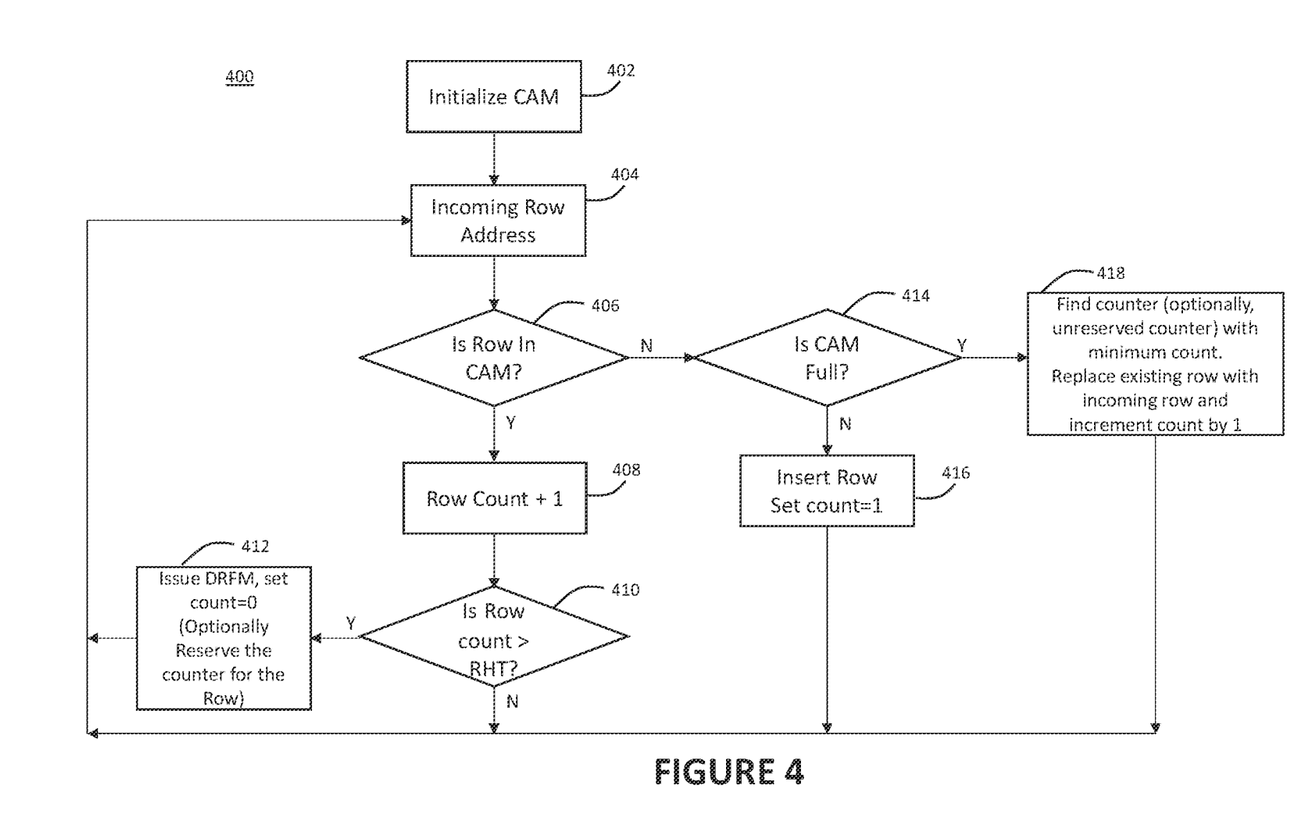
FIG. 4 illustrates a flowchart of a process for row hammer mitigation, according to some embodiments.

FIG. 4 illustrates a flowchart of a process for row hammer mitigation using aspects of the space saving algorithm described in Metwally. The "space saving" algorithm, when modified and enhanced to address row hammer scenarios as in example embodiments of this disclosure, also offers complete, accurate and precise detection of any and all row hammer scenarios.

In the example implementation shown in FIG. 4, a CAM 302 is used for maintaining the counters 308. The RHT may be preconfigured. If n is the maximum row activations during the period, then the total entries in the CAM 302 is k=n/F, where F is the RHT. As noted above a counter 308 includes a row ID 310 and a count 312 that keeps track of accesses to the corresponding row. The size of the count should at least be log2(RHT). Each row counter may also have a "reserved" bit (e.g., the sticky bit 314). The row address (row ID) size should at least be log2(the number of rows in the media being monitored). Thus, the total CAM size may be k*(row counter size+reserved bit+row address size).

At operation 402, the CAM is initialized. during which tables and metadata associated with row hammer mitigation are initialized. The counter tables have an initial state, and moreover, have to be cleared periodically. This operation may be triggered/initiated, in some embodiments, in response to a ping-pong reset operation at respective refresh (tREF) intervals of the memory device 126. The reset clears out all of the counters in the modified space saving algorithm mechanism.

At operation 404, an incoming row address is received. The incoming row address is the address of the row in the memory device 126 that is to be next accessed by the memory controller 100. That is, the row address of the aggressor row 207 is received. At operation 406, the CAM is searched for the aggressor row address. The CAM search is a parallel lookup of all CAM entries.

If the aggressor row address is found at operation 406, then at operation 408, the count associated with that aggressor row address is incremented in the CAM. At operation 410, it is determined whether the incremented count exceeds the RHT. As noted earlier in this disclosure, the RHT specifies a number of accesses for a particular row, which when exceeded, makes the system assume that data integrity of physically adjacent rows, victim rows, is compromised. If it is determined, at operation 410, that the RHT is exceeded for the aggressor row address, then at operation 412, a response is triggered to be sent to the memory device 126. The response can be a signal commanding the memory media device 126 to refresh identified victim rows (e.g., DRFM command), and the counter of the aggressor row is reset (e.g., set to 0). In some embodiments, the DRFM command that is sent to the memory device 126 may identify the aggressor row, the memory device 126 may have circuitry that determined the victim rows to be refreshed.

In some embodiments, in association with the counter of the aggressor row being reset and signaling for the victim rows to be refreshed at operation 412, additionally a flag associated with the aggressor row counter in the CAM is set to indicate that the aggressor row ID is "reserved." In some embodiments, the flag may be a bit, referred to as a "sticky bit" (e.g. sticky bit 312) that, when set (e.g. set to 1), indicates that the aggressor row ID is reserved and thus should not be considered in the selection of the minimum count value in operation 418 described below. Consequently, the sticky bit enables subsequent newly inserted rows to be initialized based on the minimum count value in the CAM while ignoring the recently refreshed rows (e.g., recently refreshed aggressor rows) which may have disproportionately low count values compared to most other rows in the table.

In another example embodiment, at operation 412, instead of setting the aggressor row's count to 0 and setting the sticky bit, the counter may be unassigned from the aggressor row, that is, the aggressor row counter is removed from the CAM. However, example embodiments in which the aggressor row is removed upon exceeding the RHT threshold may result in more frequent removals and insertions of counters to the CAM than embodiments that set the aggressor row's count to 0 and set the sticky bit.

If at operation 406 it is determined that the row address is not in the CAM, then at operation 414, it is determined whether the CAM is full. If the CAM is not full, then at operation 416 the incoming row is inserted and the count associated with the inserted row is incremented.

If at operation 414 it is determined that the CAM is full, then at operation 418, a row which has the lowest count in the CAM is identified, and that row is replaced in the CAM with the new row. The value of the counter is incremented—effectively introducing the new row to the CAM with a starting value of 1 more than the current minimum count in the CAM. Note that, as described in relation to operation 412, in some implementations in which a row in the CAM has a sticky bit set, that row may not be considered when identifying the row which has the lowest count.

Process 400 (operations 402-418), in some example embodiments, may be performed by row hammer detection circuit 304 utilizing CAM 302. In example embodiments in which system 101 include row hammer detection at the global level in the memory controller 100, then a single instance of the row hammer mitigation component 132 may be arranged in the central controller 110 or other location in which it can receive row access statistics from all media controllers 120. In embodiments in which the row hammer detection is at the channel level, each channel may have its own instance of the row hammer mitigation component 132 with a CAM 302 sized appropriately to handle the maximum level of row accesses that needs to be handled at a channel. In embodiments in which the row hammer detection is at the bank level, each bank may have its own instance of the row hammer mitigation component 132 with a CAM 302 sized appropriately to handle the maximum level of row accesses that needs to be handled at a single bank.

Figure 5:
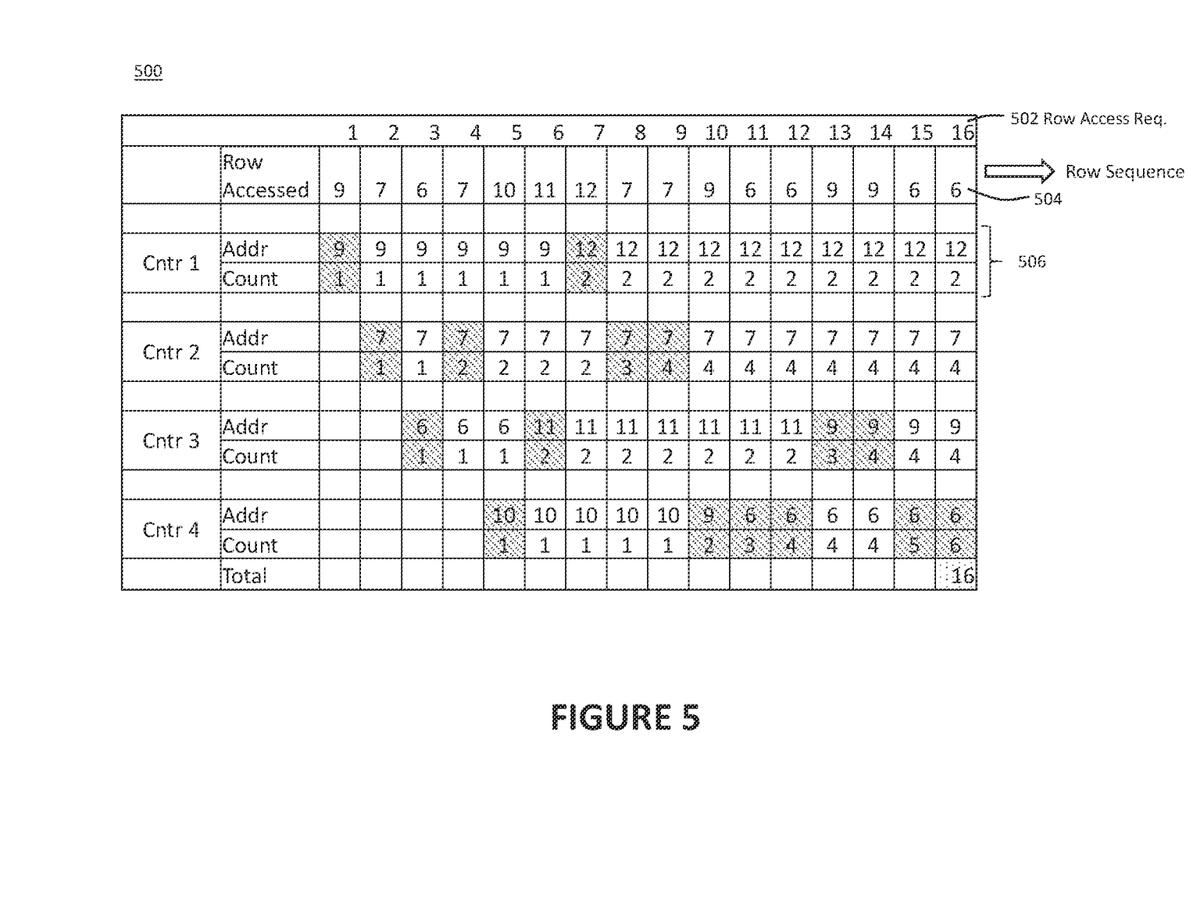
FIG. 5 is an illustration of the maintenance of a limited number of counters in accordance with the space saving algorithm as adapted for the example embodiments shown in FIG. 4.

FIG. 5 is an illustration of the maintenance of a limited number of counters in accordance with the space saving algorithm. In this example, four counters—counter 1, counter 2, counter 3 and counter 4 are maintained. Each row counter (e.g., 506) represents a row in memory device 126 at a given instance in time and comprises at least the address (e.g., row number) of the row and a count (e.g. number of accesses to the row) associated with the row. The row counters may be initialized at predetermined intervals. 502 represents a sequence of consecutive row access requests as the requests are received in the illustrated time period (between two refreshes). 504 illustrates the row sought to be accessed (aggressor row) in the corresponding row access request.

At the beginning of the illustrated period (e.g., at the beginning of the refresh interval and at the end of the reset operation 402), counters 1-4 are unassigned to any rows of memory device 126. The counters 1-4 are assigned and reassigned to rows of the memory device 126 in accordance with the row access requests being received during the illustrated interval.

Row access requests 1-3 are accesses to rows 9, 7 and 6, respectively. Since the four counters are unassigned at the beginning of the illustrated period, the counters 1, 2 and 3 are assigned to rows 9, 7 and 6 in response to the requests 1-3. The respective counters are incremented to 1 (from initial value 0). Request 4 is an access to row 7 which already has an assigned counter, and thus that counter (counter 2) is incremented from 1 to 2. Request 5 is an access to row 10, and since row 10 does not have an assigned counter and since an unassigned counter (counter 4) is available, that counter is assigned to row 10 and incremented to 1 from initial value 0.

When request 6 is received for row 10, all four counters are already assigned. That is, there are no unassigned counters. Therefore, a counter with a minimum count value (e.g., counter 308 with the minimum count among all entries in CAM 302) is identified among the assigned counters. In this instance, counters 1, 3 and 4 have the lowest count value of 1, and counter 3 is randomly selected from among the counters with the lowest count values to be reassigned to row 11. Thus, counter 3 is assigned to row 11, but the count value of counter 3 is simply incremented from the current value (i.e., the last value of the counter before the corresponding row is replaced with the selected row)—thus incremented to 2 from 1. By incrementing the count value of the counter even while that counter is reassigned from one row to another, this technique ensures that no row hammer attacks are unaccounted.

In response to request 7, counter 1 which is assigned to row 9 with a count of 1, which is the minimum count value at the time, is assigned to row 12 and the count is incremented by 1. When the counter 1 is assigned to row 12, row 9 does not have an assigned counter.

Observing requests 10 and 11, it can be seen that counter 4 is reassigned to row 9 at request 10 with an incremented counter value of 2, but then in the very next request counter 4 is selected again, based on its counter value of 2 being among the lowest counter value at the time, to be reassigned to row 6 with an incremented counter value of 3. Thus, at the end of request 11, row 9 is no longer represented in the counters.

Again, however at request 13 row 9 is accessed. Thus row 9 is reinserted into the counters by being reassigned to counter 3, which at counter value 2 is among the lowest counter values at the time. When row 9 is reintroduced to the counters at counter 3 its incremented counter value is 3. Therefore, the row access tracking process never decreases the value of a counter during a tracking and therefore never misses a potential row hammer attack even while maintaining a small number of counters compared to the total number of rows being protected.

Thus, as seen in FIG. 5 and the above description, the number of counters that is required to be maintained for process 400 is less than the total number of rows on media device 126 being monitored for row hammer events. Even if, in some embodiments, the memory controller may group the memory rows such that a common row address is used to access a group of rows, the number of counters required by process 400 would be substantially less than the number of rows separately addressable by the memory controller.

Due to its capability to provide for deterministic row hammer detection with the use of a substantially smaller number (i.e., smaller than the total number of rows of memory media being protected) of counters, the space saving algorithm can be considered for implementation as a row hammer mitigation technique. However difficult problems are encountered in implementing the space saving algorithm in relation to row hammer detection.

The update loop (e.g., operations 404-406-408-410-412) of the adapted space saving algorithm is similar to the basic row hammer update process shown in FIG. 2B. However, the adapted space saving algorithm enables deterministic row hammer mitigation with a much smaller number of counters than techniques that require one counter for each row of the memory device. The space saving algorithm counts only the rows that need to be counted in a time interval, as opposed to having a counter for every row. In some implementations, for example, whereas perfect detection according to conventional row hammer detection may have required several million counters so that each row of memory is represented by a respective counter, the modified space saving algorithm used in process 400 may require a number of counters only in the hundreds thus providing a substantial gain in efficiency and reduction of the size of state to be maintained.

The update loop and the insert operation in which a counter that is assigned to a row with a minimum row access count is reassigned to an aggressor may be performed numerous times in response to row access requests. Even though the space saving algorithm might reduce the problem of tracking row hammer attacks from billions of counters down to thousands, the implementation shown in FIG. 4 still requires accessing and doing thousands of comparisons in a short amount of time. For example, in order to handle 625 million/sec events as described above at a global (i.e., all channels) level, about 62000 events may require to be handled every 60 milliseconds. CAM 302, which provides for fast fully-associative lookups of all entries in the CAM for a particular row address, enables the system 101 to effectively perform deterministic row hammer error mitigation.

Any counter-based logic needs reset. Because different memory media rows refresh at different internal media determined times, the ideal time to reset an external counter for a particular media row may be configurable or determined at boot time. Periodic ping-pong reset is a safe counter reset that is possible when paired counters are used in a ping-pong scheme. The time between resets of any particular counter may be configurable, and is e.g., 128 ms (2×tREF) in some embodiments. According to an embodiment, during a first tREF period the ACT counter(s) is in preconditioning state where it is counting but not sending DRFM. During the next tREF period the ACT counter(s) is counting as well as triggering DRFM command(s) or other row hammer response.

A second set of ACT counter(s) operates similarly but is offset by tREF from the first set of ACT counter(s). One set of ACT counters is always active to trigger DRFM commands.

This approach eliminates false negative DRFM triggers. However, this approach requires two sets of counters meaning twice the silicon area and the power. Moreover, there is the potential DRFM is sent based on counts from 2×tREF.

Figure 6:
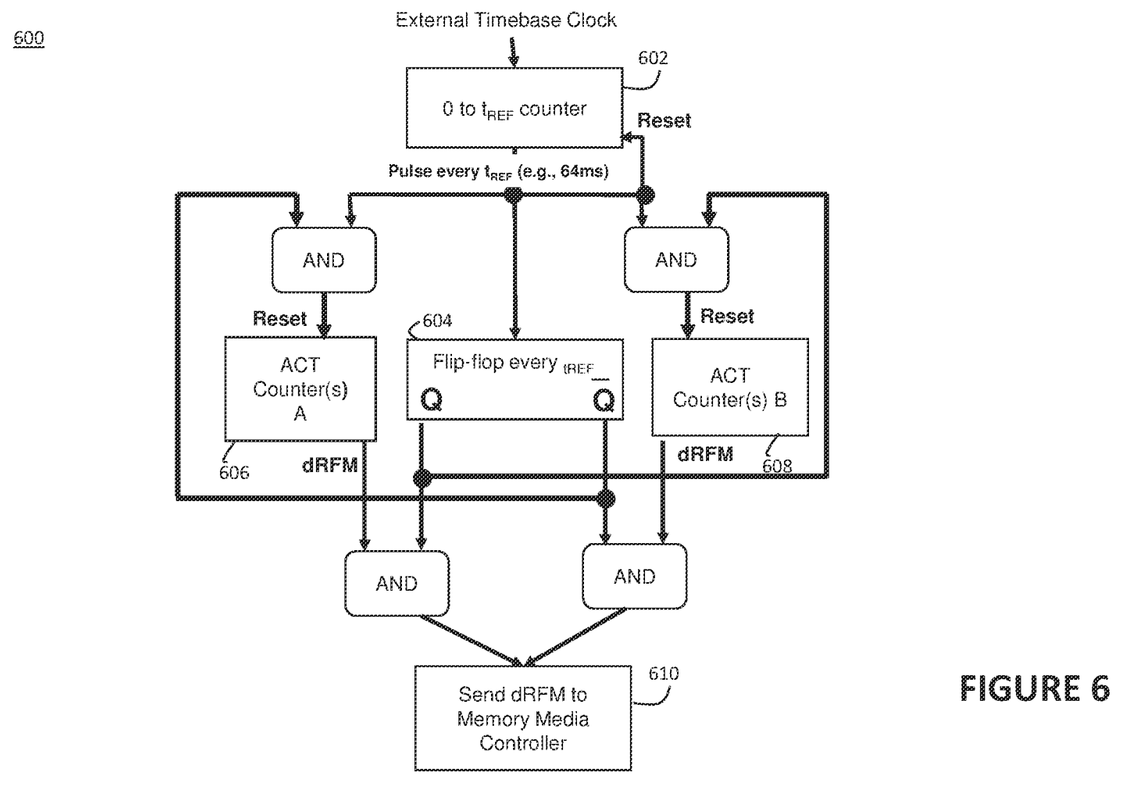
FIG. 6 shows a schematic of a ping-pong reset circuit, according to some embodiments.

FIG. 6 shows a schematic of a ping-pong reset circuit 600 according to some embodiments. An external clock serves as input to the circuit 600. Based on the input clock, a 0 to tREF counter 602 generates a pulse every tREF (e.g., 64 ms). Based on the pulse from counter 602 a flip-flop 604 toggles output between 0 and 1 every tREF. ACT Counter(s) A 606 is reset when ACT Counter(s) B 1108 becomes active (i.e., able to trigger DRFM) and vice versa.

Both ACT counter(s) A 606 and ACT counter(s) B 608 always receive and count all memory media row activations (ACTs). Both ACT counter(s) A and ACT counter(s) B trigger DRFM (or other row hammer mitigation response) when they reach the memory media RHT count, but based on the state of the flip-flop 604, only the one of the ACT counters that is "active" can trigger a DRFM, the other ACT counter(s) is ignored. Component 610 generates the DRFM to the memory media controller to be transmitted to the memory device.

Process 400 enables deterministic row hammer detection using a number of counters that is determined based on the potential number of row hammer attacks that can occur in a refresh interval of a memory device 126. As described above, this number of counters is much smaller than the number of counters that would be required if each row in the memory device had a corresponding counter. Deterministic detection of row hammer events means that the process 400 guarantees that no false negatives would exist (i.e., no instances in which a row that actually exceeds RHT is determined to not have exceeded RHT). Another advantageous property of process 400 is that it also enables bounding the number of false positive detection of row hammer events. That is, the number of false positive detections that can occur in a refresh interval is upper bounded by the size of the CAM 302 (i.e., the maximum number of counters stored in the CAM).

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "transmit", "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components.

In some examples, the flow of signals between the connected components may be interrupted for a time, for example, using one or more intermediate components such as switches or transistors. The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium.

For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

In the detailed description herein, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled", and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus configured to mitigate a row hammer event, comprising:
   a memory media device;
   a content addressable memory (CAM) configured to store a plurality of counters, each counter comprising a row identifier and a count, wherein a total number of counters is less than a total number of rows monitorable in the memory media device; and
   circuitry configured to perform operations comprising:
   determining whether a row identifier of a row access request is stored in the CAM;
   when the determining determines that the row identifier is stored in the CAM, updating the count of a counter corresponding to the row identifier in the plurality of counters, and if the count exceeds a predetermined threshold, triggering a response to an error in the memory media device;
   when the determining determines that the row identifier is not stored in the CAM, updating a counter of the plurality of counters to include the row identifier;
   wherein updating the counter of the plurality of counters to include the row identifier comprises:
   identifying a minimum count in the CAM among all rows of the CAM excluding rows in which a sticky bit is set;
   inserting the row identifier in the CAM in a row that corresponds to the identified minimum count; and
   incrementing the count in the row that corresponds to the identified minimum count.

2. The apparatus of claim 1, further comprising a memory error detector arranged in the memory media device.

3. The apparatus of claim 1, further comprising an interface to a memory error detector in a memory controller.

4. The apparatus of claim 1, wherein the CAM and the circuitry are configured to perform deterministic detection of row hammer errors in the memory media device without any false negative detections by using ping-pong reset of the plurality of counters.

5. The apparatus of claim 1, wherein the circuitry is configured to limit a maximum number of false positive detections based at least in part on a maximum number of counters stored in the CAM.

6. The apparatus of claim 1, wherein each counter further comprises a sticky bit, and wherein the circuitry is further configured to, if the count exceeds the predetermined threshold, further set the count to an initial value and set the sticky bit of the counter. the row that corresponds to the identified minimum count.

7. The apparatus of claim 1, further comprising circuitry configured to monitor all rows of one bank of a plurality of banks of the memory media device.

8. The apparatus of claim 1, further comprising circuitry configured to monitor all rows of each bank of a plurality of banks in a channel of the memory media device.

9. The apparatus of claim 1, further comprising circuitry configured to monitor all rows of a plurality of banks.

10. The apparatus of claim 1, wherein determining whether a row identifier of the row access request is stored in the CAM comprises a parallel lookup of all rows stored in the CAM to determine whether a matching entry for the row identifier of the row access request is present.

11. The apparatus of claim 10, wherein updating the counter of the plurality of counters to include the row identifier comprises:
   identifying a minimum count in the CAM and inserting the row identifier in the CAM in a location that corresponds to the identified minimum count; and
   incrementing the identified minimum count associated with the inserted row identifier.

12. The apparatus of claim 1, wherein the memory media device is dynamic random access memory (DRAM), and wherein a respective bank corresponds to a plurality of rows in the DRAM.

13. The apparatus of claim 1, further comprising circuitry configured to clear the plurality of counters in each refresh interval of the memory media device.

14. The apparatus of claim 1, wherein the response comprises a digital refresh management (DRFM) command to refresh one or more physically adjacent rows of a row corresponding to the row identifier.

15. A method performed by an apparatus configured to mitigate a row hammer event, comprising a content-addressable memory (CAM) and a memory media device, the method comprising:
   determining whether a row identifier of a row access request is present in a plurality of counters stored in the CAM, wherein each counter of a plurality of counters comprises a row identifier and a count, and a total number of counters in the plurality of counters is less than a total number of rows monitorable in the memory media device;
   determining whether a row identifier of a row access request is stored in the CAM;
   when the determining determines that the row identifier is stored in the CAM, updating the count of a counter corresponding to the row identifier in the plurality of counters, and if the count exceeds a predetermined threshold, triggering a response to an error in the memory media device;
   when the determining determines that the row identifier is not stored in the CAM, updating a counter of the plurality of counters to include the row identifier;

wherein updating the counter of the plurality of counters to include the row identifier comprises:

identifying a minimum count in the CAM among all rows of the CAM excluding rows in which a sticky bit is set;

inserting the row identifier in the CAM in a row that corresponds to the identified minimum count; and incrementing the count in the row that corresponds to the identified minimum count.

16. The method according to claim 15, wherein the method further comprises performing deterministic detection of row hammer errors in the memory media device without any false negative detections by using ping-pong reset of the plurality of counters.

17. The method according to claim 15, wherein the method further comprises limiting a maximum number of false positive detections based at least in part on a maximum number of counters stored in the CAM.

18. A memory controller comprising:
a first interface to a host system;
a second interface coupled to a memory media device, wherein the second interface comprises a plurality of physical interfaces to the memory media device and each of the physical interfaces corresponds to a respective channel having a plurality of banks;
at least one memory error detector comprising:
a content addressable memory (CAM) storing a plurality of counters, each counter comprising a row identifier and a count, and a total number of counters stored in the CAM is less than a total number of rows monitorable in the memory media device; and
circuitry configured to perform operations to mitigate a row hammer event, comprising:
determining whether a row identifier of a row access request is stored in the CAM;
when the determining determines that the row identifier is stored in the CAM, updating the count of a counter corresponding to the row identifier in the plurality of counters, and if the count exceeds a predetermined threshold, triggering a response to an error in the memory media device;
when the determining determines that the row identifier is not stored in the CAM, updating a counter of the plurality of counters to include the row identifier;
wherein updating the counter of the plurality of counters to include the row identifier comprises:
identifying a minimum count in the CAM among all rows of the CAM excluding rows in which a sticky bit is set;
inserting the row identifier in the CAM in a row that corresponds to the identified minimum count; and
incrementing the count in the row that corresponds to the identified minimum count.

19. The memory controller according to claim 18, wherein the CAM and the circuitry are arranged to perform deterministic detection of row hammer errors in the memory media device without any false negative detections by using ping-pong reset of the plurality of counters.

* * * * *